(12) United States Patent
Hacker et al.

(10) Patent No.: US 6,287,477 B1
(45) Date of Patent: Sep. 11, 2001

(54) SOLVENTS FOR PROCESSING SILSESQUIOXANE AND SILOXANE RESINS

(75) Inventors: Nigel P. Hacker, Palo Alto; Jan Nedbal, San Jose, both of CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/420,091

(22) Filed: Oct. 18, 1999

(51) Int. Cl.$^7$ ........................................ B44C 1/22
(52) U.S. Cl. .................. 216/83; 216/92; 252/79.1; 438/689; 438/745
(58) Field of Search .................. 216/83, 91, 92, 216/99; 252/79.1, 79.4; 438/689, 745, 748, 756; 134/38, 2, 40

(56) References Cited

U.S. PATENT DOCUMENTS

| 3,615,272 | 10/1971 | Collins et al. . |
|---|---|---|
| 4,886,728 | 12/1989 | Salamy et al. . |
| 4,983,490 | 1/1991 | Durham . |
| 4,999,397 | 3/1991 | Weiss et al. . |
| 5,010,159 | 4/1991 | Bank et al. . |
| 5,151,219 | 9/1992 | Salamy et al. . |
| 5,362,608 | 11/1994 | Flaim et al. . |
| 5,426,017 | 6/1995 | Johnson . |
| 5,618,878 | 4/1997 | Syktich et al. . |
| 5,637,436 | 6/1997 | Johnson . |
| 5,814,433 | 9/1998 | Nelson et al. . |
| 5,840,821 | 11/1998 | Nakano et al. . |

OTHER PUBLICATIONS

Durrant et al., *Microcontamination*, Apr. 1985, pp. 45–51.

*Primary Examiner*—William A. Powell
(74) *Attorney, Agent, or Firm*—Robert D. Fish; Fish & Associates, LLP

(57) ABSTRACT

Methods for removing unwanted siloxane and silsesquioxane dielectric film precursor residues from substrates and spin on coating devices are provided. The methods of the invention use liquid silicones to dissolve the film precursors. Solutions of the film precursors in the silicones do not undergo gelling or increase in molecular weight.

27 Claims, No Drawings

SOLVENTS FOR PROCESSING SILSESQUIOXANE AND SILOXANE RESINS

FIELD OF THE INVENTION

The present invention pertains to silicon-based solvents useful in the spin coating of silsesquioxane and siloxane resins. More particularly, the invention provides a process for removing unwanted dielectric film precursor material from the periphery of a coated substrate and components of a spin coating processor (e.g., cup, lines).

BACKGROUND OF THE INVENTION

It is known in the art that silsesquioxane and siloxane resins are useful in the electronic and semiconductor fields to coat silicon chips and other similar components. Such coatings protect the surface of substrates and form dielectric layers between electric conductors on integrated circuits. Such coatings can be used as protective coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, superlattice devices and the like. These resins include hydrogen silsesquioxane resins as well as silsesquioxane resins containing a significant portion of organic moieties.

The production of silsesquioxane resins is well known in the art. For example, Collins et al. (U.S. Pat. No. 3,615,272, issued Oct. 26, 1971) teaches the production of a nearly fully condensed resin which may contain up to 100–300 ppm silanol by a process comprising hydrolyzing trichlorosilane in a benzenesulfonic acid hydrate hydrolysis medium and then washing the resultant resin with water or aqueous sulfuric acid. Bank et al. (U.S. Pat. No. 5,010,159, issued Apr. 23, 1991) teaches a method comprising hydrolyzing hydridosilanes in an arylsulfonic acid hydrate hydrolysis medium to form a resin which is then contacted with a neutralizing agent. Other hydridosiloxane resins, such as those disclosed in Weiss et al. (U.S. Pat. No. 4,999,397, issued Mar. 12, 1991) are produced by hydrolyzing an alkoxy or acyloxy silane in an acidic, alcoholic hydrolysis medium. The use of hydrogen silsesquioxane resin in forming coatings on electronic devices is also well known in the art.

Coating techniques of general applicability in forming silicon-based coating include deposition techniques and spin coating. Spin coating per se is well known in the art, as is the equipment for such coating and the process conditions employed therein. See, for example, Wolf et al., SILICON PROCESSING FOR THE VLSI ERA, Volume 1 (Process Technology) (Lattice Press, Sunset Beach, Calif. 1986), incorporated herein by reference.

Despite its widespread use, certain undesirable results also accompany spin coating. The surface tension of the film precursor compositions, results in some of the film precursor wicking around to and coating the back side edge of the wafer during the spin-coating process. Also, as the spin-coating process progresses, the film precursor becomes progressively more viscous as the solvent evaporates. This increased viscosity can result in the formation of fine whiskers as the film precursor is spun off the wafer in the latter stages of the process. These whiskers then dry on the edge of the wafer. Moreover, as the film precursor continues to dry and increase in viscosity during the spin-coating process, excess precursor is less likely to leave the wafer and instead builds up as an edge-bead at the outer reaches of the wafer surface.

These coating-related problems can cause significant difficulties in the overall integrated circuit fabrication process. Substances on the backside of the wafer can be deposited elsewhere and cause contamination, and can also prevent the wafer from lying flat on ultraflat surfaces. The roughness on the underside of the wafer can affect a number of subsequent process characteristics, including focus, alignment, planarity, and the like. Whiskers on the wafer edges can easily break off in subsequent processing steps, causing particulate contamination in one or more regions of the manufacturing equipment. Finally, the presence of an edge-bead on the front surface edge produces a distorted surface, which can greatly affect focus, alignment, planarity and the like in later process steps.

The art is aware of the problems associated with residual film precursor at the edges and sides of the wafer, and generally seeks to overcome them by applying a small stream of a solvent for the precursor to the edge of the wafer so as to dissolve and remove the unwanted residue. In many cases, the solvent stream is applied to the backside edge of the wafer and it is permitted to wick around by capillary action to the front edges so as to remove backside edge residue, whiskers and edge bead. With certain newer equipment, it is possible to apply the solvent stream from both front and back sides of the wafer simultaneously. In all cases, the object is to remove from the wafer a strip of film precursor which is adhered to the wafer sides, the back surface outer edges of the wafer, and the outer edges of the front surface of the wafer, to leave as defect-free a film as possible. See, in this regard, Durrant et al., Microcontamination, Apr. 1985, pp. 45–51, incorporated herein by reference.

To effectively coat the film precursors onto a substrate, they are dissolved in a solvent to form coating compositions. Similarly, solvent compositions are known which are used for stripping undesired cured and uncured film precursor from wafers, removing undesired edge bead from spun wafers and cleaning related film deposition processing equipment.

Organic solvents are frequently used for these purposes. The solvents most commonly used include alcohols, methylisobutyl ketone, heptane, dibutyl ether, propylene glycol methyl ether acetate, ethyl acetate and propyl acetate. The use of unadulterated organic solvents with siloxane and silsesquioxane film precursors is problematic. For example, silsesquioxane resins (e.g., hydrogensilsesquioxane resin), tend to gel and polymerize in the presence of both polar (e.g., alcohols) and non-polar (e.g., hexanes, negative resist developer) organic solvents. These solvents are, therefore, less than ideal for use in cup-rinse. line cleaning and edge bead removal applications because film precursor forms gels and particles.

In addition, due to their toxicity, adverse environmental effects and expense of disposal, it is desirable to reduce the amount of volatile organic solvents used in semiconductor device manufacture. The odor of any chemical compound, especially one used in enclosed environments such as a fabrication laboratory for integrated circuits, has become an important selection criterion for all organic solutions. Chemicals introduced into these laboratories are required to have as high a value of odor threshold as possible, that is, maximum amount of solvent vapor in the environment without causing any deleterious health effects.

A method for removing the edge bead and cleaning the components of the spin coating apparatus with a solvent that did not cause gelling and/or polymerization of silsesquioxane and siloxane resins would constitute a significant advance in semiconductor device manufacturing. Moreover, solvents useful for these purposes that were of low volatility and low toxicity would be highly desirable. Quite surprisingly, the present invention provides such a method.

SUMMARY OF THE INVENTION

It has now been found that solvents based upon the $R_2SiO$ and $R_3SiO$ functional groups do not cause silsesquioxane or siloxane resins to gel or to undergo further polymerization upon solvation. These solvents are therefore suitable for removing the edge bead from substrates coated with silsesquioxane and/or siloxane resins. Moreover, these solvents are useful as cleaning agents for the components of the spin on device that come into contact with the resins.

In addition to their ability to form stable solutions with silsesquioxane and siloxane resins, these solvents are compatible with commonly used cup and spin-coater materials (e.g., polyvinylchloride, high-density polyethylene, etc.). Furthermore, these solvents are much less of a health and an environmental hazard than conventionally used solvents, such as methylisobutylketone, Stoddart Solvent (Negative Resist Developer) and the like.

In a first aspect, the present invention provides a method for removing from a substrate an edge bead comprising a member selected from silsesquioxane resin, siloxane resin and combinations thereof. The method comprises, contacting the edge bead with a solvent comprising a silicone having a structural unit which is a member selected from $R^1R^2SiO$—, $R^3R^4R^5SiO$—and combinations thereof. $R^1$, $R^2$, $R^3$, $R^4$ and $R^5$ are members independently selected from hydrogen, aryl, straight-chain alkyl, substituted straight-chain alkyl, branched chain alkyl and substituted branched chain alkyl groups.

In a second aspect, the present invention provides a method for removing from a substrate an edge bead comprising a T-cage silsesquioxane resin dielectric film precursor. The method comprises, contacting the edge bead with a solvent comprising a compound having the formula:

$$R_3SiO\text{---}[\text{---}SiR_2\text{---}O]_nSiR_3$$

in which R is selected from H, $C_1$–$C_8$ straight chain alkyl and $C_1$–$C_8$ branched-chain alkyl; and n is a number from 0 to In a third aspect, the present invention provides a method for removing from components of a spin on coating device, a material comprising a member selected from silsesquioxane, siloxane and combinations thereof. The method comprises, contacting the edge bead with a solvent comprising a silicone having a structural unit which is a member selected from $R^1R^2SiO$—, $R^3R^4R^5SiO$— and combinations thereof. $R^1$, $R^2$, $R^3$, $R^4$ and $R^5$ are members independently selected from hydrogen, aryl, straight-chain alkyl, substituted straight-chain alkyl, branched chain alkyl and substituted branched chain alkyl groups.

In a fourth aspect, the present invention provides a method for removing from components of a spin on coating device, a material comprising a T-cage silsesquioxane resin dielectric film precursor. The method comprises, contacting the components with a solvent comprising a compound having the formula:

$$R_3SiO\text{---}[\text{---}SiR_2\text{---}O]_nSiR_3$$

in which R is selected from H, $C_1$–$C_8$ straight chain alkyl and $C_1$–$C_8$ branched-chain alkyl; and n is a number from 0 to 5 inclusive.

Other features, objects and advantages of the invention and its preferred embodiments will be apparent from the detailed description which follows.

DETAILED DESCRIPTION OF THE INVENTION AND THE PREFERRED EMBODIMENTS

In a first aspect, the present invention provides a method for removing from a substrate an edge bead comprising a member selected from silsesquioxane resin, siloxane resin and combinations thereof. The method comprises, contacting the edge bead with a solvent comprising a silicone having a structural unit which is a member selected from $R^1R^2SiO$—, $R^3R^4R^5SiO$—and combinations thereof. $R^1$, $R^2$, $R^3$, $R^4$ and $R^5$ are members independently selected from hydrogen, aryl, straight-chain alkyl, substituted straight-chain alkyl, branched chain alkyl and substituted branched chain alkyl groups.

A wide array of silicones having different R group substituents are commercially available (Hüls America Inc., Piscataway, N.J.) or can be readily prepared by methods known to those of skill in the art from commercially available reactive intermediates (Hüls America Inc., Piscataway, N.J.; AP Resources Group, Seoul, South Korea). Presently preferred silicones have R groups such as straight-chain alkyl, fluoroalkyl groups and phenyl groups. Although these groups are preferred, in practice, substantially any silicone that is a free flowing liquid at the temperature at which the process is conducted can be used to practice the present invention. Silicones that are liquid at temperatures above 15° C. are presently preferred.

In certain embodiments, it is desirable to use the silicone in a blend with one or more other components. Preferred blends include those containing two or more silicones having distinct structures and blends of one or more silicones with one or more organic solvents. Silicones are soluble in a number of organic solvents including, for example, methylene chloride, acetone, ethanol dioxane and the like. Blends can be used, for example, to optimize the rate with which the dielectric film precursor dissolves into the silicone, the solvation capacity of the silicone, the viscosity of the silicone and/or its useful working temperature range. In certain applications where an organic solvent is necessary or desirable, silicones can be used to reduce the amount of organic solvent used. Moreover, silicones can be used to impart desirable characteristics to the organic solvent (e.g., lower volatility, higher viscosity, increased compatibility with dielectric film precursors, etc.).

In a further preferred embodiment, the solvent comprises a silicone having the formula:

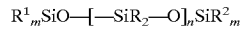

$$R^1_mSiO\text{---}[\text{---}SiR_2\text{---}O]_nSiR^2_m$$

wherein, R, $R^1$ and $R^2$ are members independently selected from H, $C_1$–$C_8$ straight chain alkyl and $C_1$–C8 branched-chain alkyl; m is 2 or 3; and n is a number from 0 to 5 inclusive. When m is 2, $R^1$ and $R^2$ are connected to form a cyclic silicone molecule.

Examples of useful linear solvents nonexclusively include decamethyltetrasiloxane, 1,3-dioctyltetramethyldisiloxane, octamethyltrisiloxane, pentamethyldisiloxane, hexamethyldisiloxane, 1,1,3,3,5,5-hexamethyltrisiloxane, 1,1,3,3,-tetramethyldisiloxane, 1,3-bis-(trimethylsiloxy)-1,3-dimethylsiloxane, bis(trimethylsiloxy)ethylsilane, bis(trimethylsiloxy)methylsilane, decamethyltetrasiloxane, dodecamethylpentasiloxane, 1,1,1,3,3,5,5-heptamethyltrisiloxane, hexaethyldisiloxane, heptamethyltrisiloxane and 1,1,3,3-tetraisopropyldisiloxane.

Examples of useful cyclic solvents nonexclusively include decamethylcyclopentasiloxane, hexaethylcyclotrisiloxane, hexamethylcyclotrisiloxane, 1,3,5,7-tetramethylcyclotetrasiloxane, pentamethylcyclopentasiloxane, octamethylcyclotetrasiloxane, methylhydrocyclosiloxanes of the formula $(CH_3HSiO)_{3-5}$, 1,3,5,7,tetraethylcyclotetrasiloxane and 1,3,5,7,tetramethylcyclotetrasiloxane.

In a further preferred embodiment, the R groups are methyl or ethyl groups. As a wide range of trimethylsiloxy terminated polydimethylsiloxanes are readily available from commercial sources, in a further preferred embodiment R is a methyl group. Preferred linear methylsilicones include octamethyltrisiloxane and hexamethyldisiloxane, and preferred cyclic methylsilicones include decamethylcyclopentasiloxane and octamethylcyclotetrasiloxane.

One of skill will be able to easily test any silicone species for its ability to perform in the methods of the invention. In an exemplary assay, a dielectric film precursor of known molecular weight is dissolved and incubated for a selected period of time in a solvent comprising a silicone. During the incubation, aliquots of the solution are taken and the film precursor is assayed for any increase in molecular weight by known methods such as gel permeation chromatography, gel permeation high performance liquid chromatography, mass spectrometry and the like. As the formation of gels and precipitates is readily apparent to the naked eye, the film precursor solution can also be assayed visually. Other useful means of assaying a silicone or silicone blend for its usefulness in practicing the present invention will be apparent to those of skill in the art.

Methods for removing dielectric film precursor edge beads from a coated silicon wafer are well known in the art (see, for example, Wolf et al., SILICON PROCESSING FOR THE VLSI ERA, Volume I (Process Technology) (Lattice Press, Sunset Beach, Calif. 1986), incorporated herein by reference). These methods are readily adaptable to the use of silicones and silicone solvent blends. In the simplest adaptation, the organic solvent is simply replaced by a silicone or silicone blend. One of skill will find the methods set forth herein readily adaptable to use with a range of dielectric film precursor structures, film thicknesses and the like.

In an exemplary embodiment using a spin-on coating process, the coating solution is typically dispensed on a spinning wafer substrate. The force exerted on the spinning coating solution may cause an amount of the solution to build up on the edge portion of the substrate forming an edge bead. Typically the edge bead is displaced about 3 mm from the edge of the wafer. The solvents of the invention are used in the process of edge bead removal which is performed after dispensing the coating solution and before the coated substrate is baked and cured. The edge bead removal process includes dispensing a solvent from a nozzle positioned near the edge of the wafer such that the solvent is deposited on an edge portion of the surface of the substrate including the edge bead. A typical process includes a from 1 to 5 second dispense spin at 1500 rpm and a spin dry step consisting of a 2 to 6 second spin at from 1500 to 3000 rpm.

Following the coating solution deposition and proceeding the edge bead removal, additional cleaning steps are typically carried out. These cleaning steps, for which some typical parameters are provided, include a wafer backside rinse (5 second spin at 800 rpm), and a nozzle rinse (1 second spin at 3000 rpm). The liquid silicones described herein are advantageously used as solvents for the wafer backside rinsing, edge bead removal, and general equipment clean up.

The method of the invention is particularly useful in conjunction with T-cage silsesquioxane dielectric film precursors. T-cage silscsquioxanes have branch points with the structure:

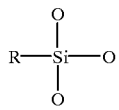

in which R is an alkyl group or substituted alkyl group bonded to the silicon atoms of the silsesquioxane cage. The alkylated silsesquioxane cages are easily prepared using art-recognized techniques and these molecules can be deposited onto substrates using spin on techniques. Following its deposition onto a substrate, the alkylated silsesquioxane layer is cured, producing low k dielectric layer.

Thus, in a second aspect, the invention provides a method for removing from a substrate an edge bead comprising a T-cage silsesquioxane resin dielectric film precursor. The method comprises, contacting the edge bead with a solvent comprising a silicone having the formula:

wherein, R is a member selected from H, $C_1$–$C_8$ straight chain alkyl and $C_1$–$C_8$ branched-chain alkyl; and n is a number from 0 to 5 inclusive.

Although substantially any $C_1$–$C_8$ alkyl group can be used to practice the methods of the invention, preferred R groups are $C_1$–$C_6$ alkyl groups, more preferably methyl and ethyl groups. As in the embodiments discussed above, preferred silicones are those which hare liquid at temperatures above about 15° C.

This aspect of the invention can be practiced using solvents that are blends of two or more silicones or blends with silicones and organic solvents. These blended solvents will have characteristics that are substantially identical to those discussed above.

In a third aspect, the present invention provides a method for removing from components of a spin on coating device, a material comprising a member selected from silsesquioxane, siloxane and combinations thereof. The method comprises, contacting the components with a silicone having a structural unit which is a member selected from $R^1R^2SiO$—, $R^3R^4R^5SiO$— and combinations thereof, wherein $R^1$, $R^2$, $R^3$, $R^4$ and $R^5$ are members independently selected from hydrogen, straight-chain alkyl and branched chain alkyl.

The preferred embodiments of this aspect of the invention are substantially similar to set forth above for the first aspect of the present invention.

In a fourth aspect, the present invention provides a method for removing from components of a spin on coating device, a material comprising a T-cage silsesquioxane resin dielectric film precursor. The method comprises, contacting the components with a solvent comprising a compound having the formula:

in which R is a member selected from $C_1$–$C_8$ straight chain alkyl and $C_1$–$C_8$ branched-chain alkyl; and n is a number from 0 to 5 inclusive.

The preferred embodiments of this aspect of the invention are substantially similar to set forth above for the second aspect of the present invention.

It is understood that the examples and embodiments described herein are for illustrative purposes only and that various modifications or changes in light thereof will be suggested to persons skilled in the art and are to included within the spirit and purview of this application and are considered within the scope of the appended claims. All publications, patents, and patent applications cited herein are hereby incorporated by reference in their entirety for all purposes.

What is claimed is:

1. A method for removing from a substrate an edge bead comprising a member selected from silsesquioxane resin, siloxane resin and combinations thereof, said method comprising:

contacting said edge bead with a solvent comprising a silicone having a structural unit which is a member selected from $R^1R^2SiO—$, $R^3R^4R^5SiO—$ and combinations thereof, wherein:

$R^1$, $R^2$, $R^3$, $R^4$ and $R^5$ are members independently selected from hydrogen, aryl, straight-chain alkyl, substituted straight-chain alkyl, branched chain alkyl and substituted branched chain alkyl groups.

2. The method according to claim 1, wherein $R^1$, $R^2$, $R^3$, $R^4$ and $R^5$ are members independently selected from straight-chain alkyl groups, straight-chain fluoroalkyl groups and phenyl groups.

3. The method according to claim 1, wherein $R^1$, $R^2$, $R^3$, $R^4$ and $R^5$ are members independently selected from methyl groups and ethyl groups.

4. The method according to claim 1, wherein said silicone is a liquid at temperatures above 15° C.

5. The method according to claim 1, wherein said solvent further comprises an organic solvent.

6. The method according to claim 1, wherein said solvent comprises a silicone having the formula:

wherein,

R, $R^1$ and $R^2$ are members independently selected from H, $C_1$–$C_8$ straight chain alkyl and $C_1$–$C_8$ branched-chain alkyl;

m is a number from 0 to 5 inclusive; and n is 2 or 3, wherein;

when n is 2, $R^1$ and $R^2$ are connected to form a cyclic silicone molecule.

7. The method according to claim 6, wherein the silicone is a member selected from decamethyltetrasiloxane, 1,3-dioctyltetramethyldisiloxane, octamethyltrisiloxane, pentamethyldisiloxane, hexamethyldisiloxane, 1,1,3,3,5,5-hexamethyltrisiloxane, 1,1,3,3,-tetramethyldisiloxane, 1,3-bis-(trimethylsiloxy)-1,3-dimethylsiloxane, bis(trimethylsiloxy)ethylsilane, bis(trimethylsiloxy)methylsilane, decamethyltetrasiloxane, dodecamethylpentasiloxane, 1,1,1,3,3,5,5-heptamethyltrisiloxane, hexaethyldisiloxane, heptamethyltrisiloxane and 1,1,3,3-tetraisopropyldisiloxane, decamethylcyclopentasiloxane, hexaethylcyclotrisiloxane, hexamethylcyclotrisiloxane, 1,3,5,7-tetramethylcyclotetrasiloxane, pentamethylcyclopentasiloxane, octamethylcyclotetrasiloxane, methylhydrocyclosiloxanes of the formula $(CH_3HSiO)_{3-5}$, 1,3,5,7, tetraethylcyclotetrasiloxane and 1,3,5,7, tetramethylcyclotetrasiloxane and combinations thereof.

8. The method according to claim 7, wherein the silicone is a member selected from octamethyltrisiloxane, hexamethyldisiloxane, decamethylcyclopentasiloxane, octamethylcyclotetrasiloxane and combinations thereof.

9. The method according to claim 1, wherein said substrate comprises a semiconductor.

10. A method for removing from a substrate an edge bead comprising a T-cage silsesquioxane resin dielectric film precursor, said method comprising:

(a) contacting said edge bead with a solvent comprising a silicone having the formula

wherein:

R, is selected from H, $C_1$–$C_8$ straight chain alkyl and $C_1$–$C_8$ branched-chain alkyl; and n is a number from 0 to 5 inclusive.

11. The method according to claim 10, wherein R is a member selected from $C_1$–$C_6$ straight-chain alkyl groups, $C_1$–$C_6$ straight-chain fluoroalkyl groups and phenyl groups.

12. The method according to claim 11, wherein R is a member selected from methyl groups and ethyl groups.

13. The method according to claim 10, wherein said silicone is a liquid at temperatures above about 15° C.

14. The method according to claim 10, wherein said solvent further comprises an organic solvent.

15. A method for removing from components of a spin on coating device, a material comprising a member selected from silsesquioxane, siloxane and combinations thereof, said method comprising:

contacting said edge bead with a solvent comprising a silicone having a structural unit which is a member selected from $R^1R^2SiO—$, $R^3R^4R^5SiO—$ and combinations thereof, wherein:

$R^1$, $R^2$, $R^3$, $R^4$ and $R^5$ are members independently selected from hydrogen, aryl, straight-chain alkyl, substituted straight-chain alkyl, branched chain alkyl and substituted branched chain alkyl groups,.

16. The method according to claim 15, wherein $R^1$, $R^2$, $R^3$, $R^4$ and $R^5$ are members independently selected from straight-chain alkyl groups, straight-chain fluoroalkyl groups and phenyl groups.

17. The method according to claim 16, wherein $R^1$, $R^2$, $R^3$, $R^4$ and $R^5$ are members independently selected from methyl groups and ethyl groups.

18. The method according to claim 15, wherein said silicone is a liquid at temperatures above 15° C.

19. The method according to claim 15, wherein said solvent further comprises an organic solvent.

20. The method according to claim 15, wherein said solvent comprises a silicone having the formula:

wherein,

R, $R^1$ and $R^2$ are members independently selected from H, $C_1$–C8 straight chain alkyl and $C_1$–$C_8$ branched-chain alkyl;

m is a number from 0 to 5 inclusive; and n is 2or 3, wherein;

when m is 2, $R^1$ and $R^2$ are connected to form a cyclic silicone molecule.

21. The method according to claim 20, wherein the silicone is a member selected from decamethyltetrasiloxane, 1,3-dioctyltetramethyldisiloxane, octamethyltrisiloxane, pentamethyldisiloxane, hexamethyldisiloxane, 1,1,3,3,5,5- hexamethyltrisiloxane, 1,1,3,3, -tetramethyldisiloxane, 1,3-bis-(trimethylsiloxy)-1,3-dimethylsiloxane, bis(trimethylsiloxy)e-hylsilane, bis(trimethylsiloxy)methylsilane, decamethyltetrasiloxane, dodecamethylpentasiloxane, 1,1,1,3,3,5,5-heptamethyltrisiloxane, hexaethyldisiloxane, heptamethyltrisiloxane and 1,1,3,3-tetraisopropyldisiloxane, decamethylcyclopentasiloxane, hexaethylcyclotrisiloxane, hexamcthylcyclotrisiloxane, 1,3,5,7-tetramethylcyclotetrasiloxane, pentamethylcyclopentasiloxane, octamethylcyclotetrasiloxane, methylhydrocyclosiloxanes of the formula $(CH_3HSiO)_{3-5}$, 1,3,5,7-tetraethylcyclotetrasiloxane and 1,3,5,7, tetramethylcyclotetrasiloxane and combinations thereof.

22. The method according to claim 21, wherein the silicone is a member selected from octamethyltrisiloxane, hexamethyldisiloxane, decamethylcyclopentasiloxane, octamethylcyclotetrasiloxane and combinations thereof.

23. A method for removing from components of a spin on coating device, a material comprising a T-cage silsesquioxane resin dielectric film precursor, said method comprising:

(a) contacting said components with a solvent comprising a compound having the formula:

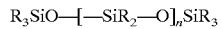

wherein,

R is a member selected from hydrogen, aryl, straight-chain alkyl, substituted straight-chain alkyl, branched chain alkyl and substituted branched chain alkyl groups.

24. The method according to claim 20, wherein R is a member selected from $C_1$–$C_6$ straight-chain alkyl groups, $C_1$–$C_6$ straight-chain fluoroalkyl groups and phenyl groups.

25. The method according to claim 23, wherein R is a member selected from methyl groups and ethyl groups.

26. The method according to claim 23, wherein said silicone is a liquid at temperatures above about 15° C.

27. The method according to claim 23, wherein said solvent further comprises an organic solvent.

* * * * *